United States Patent
Yap et al.

(10) Patent No.: US 9,524,950 B2
(45) Date of Patent: *Dec. 20, 2016

(54) STACKED MICROELECTRONIC PACKAGES HAVING SIDEWALL CONDUCTORS AND METHODS FOR THE FABRICATION THEREOF

(71) Applicants: Weng F. Yap, Phoenix, AZ (US); Michael B. Vincent, Chandler, AZ (US)

(72) Inventors: Weng F. Yap, Phoenix, AZ (US); Michael B. Vincent, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/906,621

(22) Filed: May 31, 2013

(65) Prior Publication Data

US 2014/0353840 A1   Dec. 4, 2014

(51) Int. Cl.
*H01L 21/44* (2006.01)
*H01L 23/00* (2006.01)
*H01L 25/10* (2006.01)
*H01L 25/00* (2006.01)

(52) U.S. Cl.
CPC .............. *H01L 24/97* (2013.01); *H01L 24/19* (2013.01); *H01L 24/96* (2013.01); *H01L 25/105* (2013.01); *H01L 25/50* (2013.01); H01L 2224/04105 (2013.01); H01L 2225/1035 (2013.01); H01L 2225/1064 (2013.01); H01L 2225/1076 (2013.01); H01L 2924/12042 (2013.01); H01L 2924/14 (2013.01); H01L 2924/1461 (2013.01); H01L 2924/1815 (2013.01)

(58) Field of Classification Search
CPC ................... H01L 2225/06582; H01L 25/0657
USPC ........................................ 257/774, 777, 686
See application file for complete search history.

(56) References Cited

U.S. PATENT DOCUMENTS

| | | |
|---|---|---|
| 4,866,501 A | 9/1989 | Shanefield |
| 5,019,946 A | 5/1991 | Eichelberger et al. |
| 5,279,991 A | 1/1994 | Minahan et al. |
| 5,432,729 A | 7/1995 | Carson et al. |
| 5,465,186 A | 11/1995 | Bajorek et al. |
| 5,675,180 A | 10/1997 | Pedersen et al. |
| 5,847,448 A | 12/1998 | Val et al. |

(Continued)

OTHER PUBLICATIONS

Rabaey, J. et al., "Digital Integrated Circuits", Jan. 2003, Pearson Education, 2nd Ed. 38-40.

(Continued)

*Primary Examiner* — Kevin M Picardat

(57) ABSTRACT

A method for fabricating a stacked microelectronic device includes attaching a first package layer to a second package layer to form stacked microelectronic layers. Saw streets of the first package layer overlie and are aligned with saw streets of the second package layer. The first and second package layers include respective edge connectors formed between the saw streets and electronic components in the first and second package layers. A through package via is formed in one of the saw streets of the first and second package layers. The via is filled with conductive material. The stacked package layers are singulated along the saw streets in a manner that retains a portion of the conductive material to form a sidewall connector between at least two of the edge connectors.

18 Claims, 5 Drawing Sheets

(56) References Cited

U.S. PATENT DOCUMENTS

| | | | |
|---|---|---|---|
| 5,977,640 A | 11/1999 | Bertin et al. | |
| 6,467,880 B2 | 10/2002 | Rhodes | |
| 6,560,109 B2 | 5/2003 | Yamaguchi et al. | |
| 6,607,941 B2 | 8/2003 | Prabhu et al. | |
| 6,674,159 B1 | 1/2004 | Peterson | |
| 6,818,977 B2 | 11/2004 | Poo et al. | |
| 6,822,191 B2 | 11/2004 | De Steur et al. | |
| 6,855,572 B2 | 2/2005 | Jeung et al. | |
| 7,394,152 B2 | 7/2008 | Yu et al. | |
| 7,560,215 B2 | 7/2009 | Sharma et al. | |
| 7,605,457 B2 | 10/2009 | Hoshino | |
| 7,723,159 B2 | 5/2010 | Do et al. | |
| 7,732,907 B2 | 6/2010 | Han et al. | |
| 7,741,156 B2 | 6/2010 | Pagaila et al. | |
| 7,759,800 B2* | 7/2010 | Rigg et al. | 257/774 |
| 7,829,998 B2 | 11/2010 | Do et al. | |
| 7,838,979 B2 | 11/2010 | Oh | |
| 7,843,046 B2 | 11/2010 | Andrews et al. | |
| 7,951,649 B2 | 5/2011 | Val | |
| 7,972,650 B1 | 7/2011 | Church et al. | |
| 7,994,621 B2 | 8/2011 | Kim | |
| 8,012,802 B2 | 9/2011 | Sasaki et al. | |
| 8,030,179 B2 | 10/2011 | Hoshino | |
| 8,134,229 B2 | 3/2012 | Sasaki | |
| 8,247,268 B2 | 8/2012 | Do et al. | |
| 8,362,621 B2* | 1/2013 | Lee et al. | 257/774 |
| 8,796,561 B1 | 8/2014 | Scanlan et al. | |
| 2002/0121702 A1 | 9/2002 | Higgins, III | |
| 2003/0138610 A1 | 7/2003 | Tao | |
| 2006/0043569 A1* | 3/2006 | Benson | H01L 21/76898 257/698 |
| 2008/0274603 A1* | 11/2008 | Do | H01L 21/76898 438/462 |
| 2009/0039528 A1 | 2/2009 | Haba et al. | |
| 2009/0134527 A1 | 5/2009 | Chang | |
| 2009/0160065 A1 | 6/2009 | Haba et al. | |
| 2009/0230533 A1 | 9/2009 | Hoshino et al. | |
| 2010/0001407 A1 | 1/2010 | Krause et al. | |
| 2010/0140811 A1 | 6/2010 | Leal et al. | |
| 2010/0270668 A1 | 10/2010 | Marcoux | |
| 2010/0320584 A1 | 12/2010 | Takano | |
| 2011/0012246 A1 | 1/2011 | Andrews, Jr. et al. | |
| 2011/0037159 A1 | 2/2011 | Mcelrea et al. | |
| 2011/0115091 A1 | 5/2011 | Watanabe | |
| 2011/0304011 A1* | 12/2011 | Lee | H01L 21/561 257/531 |
| 2012/0119385 A1 | 5/2012 | Co et al. | |
| 2012/0187577 A1 | 7/2012 | Cordes et al. | |
| 2012/0193785 A1 | 8/2012 | Lin et al. | |
| 2012/0313209 A1 | 12/2012 | Oganesian | |
| 2013/0010441 A1 | 1/2013 | Oganesian et al. | |
| 2013/0049225 A1 | 2/2013 | Kang et al. | |
| 2014/0054783 A1 | 2/2014 | Gong et al. | |
| 2014/0054797 A1* | 2/2014 | Gong | H01L 23/49805 257/777 |
| 2014/0264948 A1 | 9/2014 | Chou et al. | |

OTHER PUBLICATIONS

Restriction Requirement mailed Apr. 11, 2014 for U.S. Appl. No. 13/591,924, 9 pages.
Non-Final Office Action mailed Jul. 24, 2014 for U.S. Appl. No. 13/591,924, 16 pages (892).
Final Office Action mailed Nov. 19, 2014 for U.S. Appl. No. 13/591,924, 21 pages.
Non-Final Office Action mailed Sep. 13, 2013 for U.S. Appl. No. 13/591,969, 18 pages.
Final Office Action mailed Feb. 14, 2014 for U.S. Appl. No. 13/591,969 16 pages.
Final Office Action mailed Sep. 22, 2014 for U.S. Appl. No. 13/591,969 17 pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Non-Final Office Action mailed Jul. 5, 2013 for U.S. Appl. No. 13/591,990, 6 pages.
Final Office Action mailed Dec. 19, 2013 for U.S. Appl. No. 13/591,990, 6 pages.
Notice of Allowance mailed Jan. 8, 2015 for U.S. Appl. No. 13/591,90, 6 pages.
Final Office Action mailed Dec. 5, 2014 for U.S. Appl. No. 13/829,737, 10 pages.
Restriction Requirement mailed Jan. 29, 2015 for U.S. Appl. No. 14/097,424, 8 pgs.
U.S. Appl. No. 13/591,990, filed Aug. 22, 2012, entitled "Stacked Microelectronic Packages Having Sidewall Conductors and Methods for the Fabrication Thereof".
U.S. Appl. No. 13/829,737, filed Mar. 14, 2013, entitled "Stacked Microelectronic Packages Having Sidewall Conductors and Methods for the Fabrication Thereof".
U.S. Appl. No. 14/042,623, filed Sep. 30, 2013, entitled "Devices and Stacked Microelectronic Packages with Parallel Conductors and Intra-Conductor Isolator Structures and Method of their Fabrication".
U.S. Appl. No. 14/042,628, filed Sep. 30, 2013, entitled "Devices and Stacked Microelectronic Packages with In-Trench Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
U.S. Appl. No. 14/573,519, filed Dec. 17, 2014, entitled "Microelectronic Devices with Multi-Layer Package Surface Conductors and Methods of Their Fabrication".
Final Office Action mailed Aug. 11, 2015 for U.S. Appl. No. 13/829,737, 11 pages.
Non-Final Office Action mailed Jul. 31, 2015 for U.S. Appl. No. 14/706,359, 7 pages.
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed Mar. 6. 2015 for U.S. Appl. No. 13/829,737, 11 pages.
U.S. Appl. No. 13/829,737, Office Action—Restriction, mailed May 23, 2014.
U.S. Appl. No. 13/829,737, Office Action—Pre-Interview Communication (Pilot Program), mailed Aug. 14, 2014.
Notice of Allowance mailed Apr. 2, 2015 for U.S. Appl. No. 13/591,969, 8 pages.
Notice of Allowance mailed May 19, 2015 for U.S. Appl. No. 13/591,924, 8 pages.
U.S. Appl. No. 13/591,924, Gong, et al., "Stacked Microelectronic Packages Having Sidewall Conductors and Methods for the Fabrication Thereof", filed Aug. 22, 2012.
U.S. Appl. No. 13/591,969, Gong, et al., Stacked Microelectroinc Packages Having Patterned Sidewall Conductors and Methods for the Fabrication Thereof, filed Aug. 22, 2012.
Non-Final Office Action mailed May 22, 2015 for U.S. Appl. No. 14/097,424, 13 pages.
Notice of Allowance mailed Feb. 3, 2015 for U.S. Appl. No. 14/042,628, 12 pages. (892).
Non-Final Office Action mailed Feb. 12, 2015 for U.S. Appl. No. 14/097,459, 16 pages.
Notice of Allowance mailed Jan. 29, 2016 for U.S. Appl. No. 13/829,737, 11 pages.
Notice of Allowance mailed Dec. 3, 2015 for U.S. Appl. No. 14/097,459, 9 pages.
Restriction Requirement mailed Jan. 5, 2016 for U.S. Appl. No. 14/573,519, 6 pages.

(56) References Cited

OTHER PUBLICATIONS

Final Office Action mailed Sep. 4, 2015 for U.S. Appl. No. 14/097,459, 10 pages.
Notice of Allowance mailed Oct. 8, 2015 for U.S. Appl. No. 14/097,424, 9 pages.
Notice of Allowance, Sep. 14, 2016 for U.S. Appl. No. 14/573,519, 8 pages.
Notice of Allowance, Sep. 14, 2016 for U.S. Appl. No. 14/994,967, 20 pages.

* cited by examiner

STACKED MICROELECTRONIC PACKAGES HAVING SIDEWALL CONDUCTORS AND METHODS FOR THE FABRICATION THEREOF

TECHNICAL FIELD

Embodiments of the present disclosure relate generally to microelectronic packaging and, more particularly, to stacked microelectronic packages having sidewall conductors and methods for the fabrication thereof.

BACKGROUND

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and.

Figure 1:
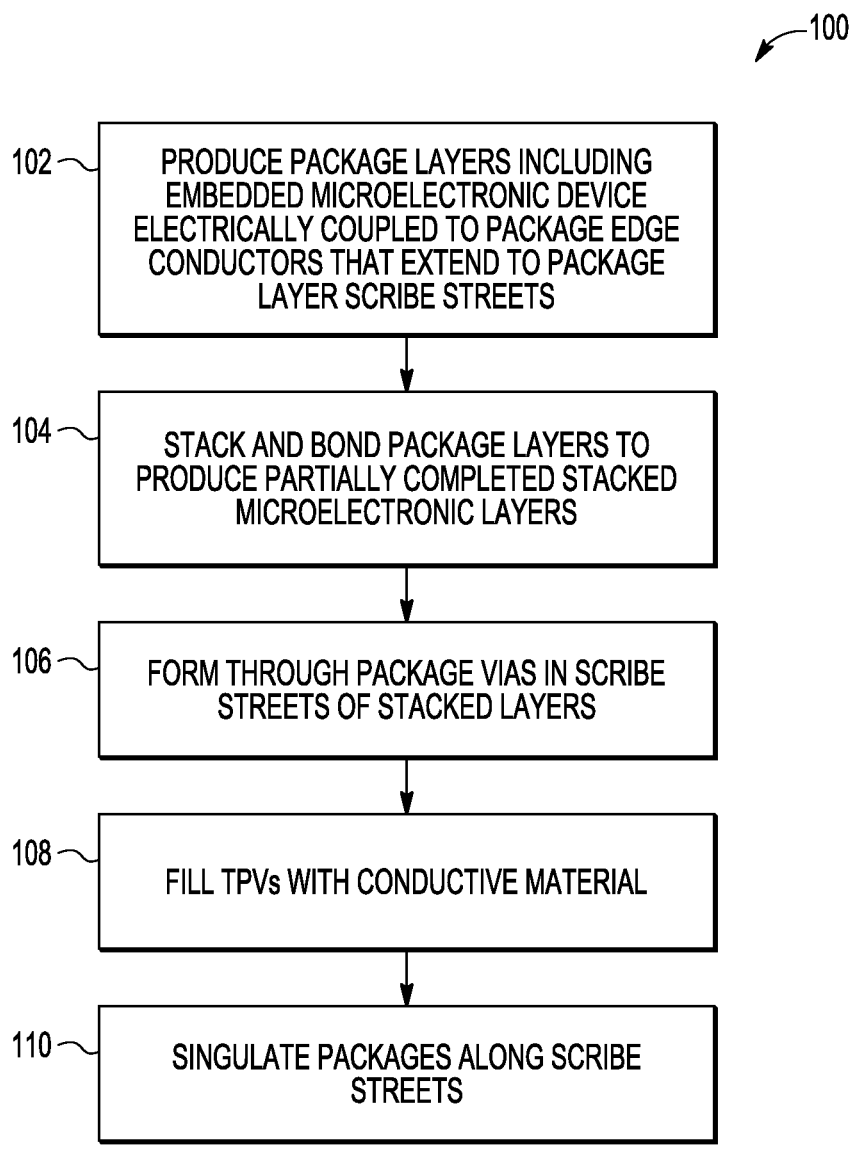
FIG. 1 is a flowchart of an embodiment of a method for fabricating a number of stacked microelectronic packages.

For simplicity and clarity of illustration, the drawing figures illustrate the general manner of construction and may omit depiction, descriptions, and details of well-known features and techniques to avoid unnecessarily obscuring the and non-limiting embodiments of the disclosure described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following Detailed Description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding Background or the following Detailed Description.

The following describes embodiments of a method for fabricating stacked microelectronic packages. Reductions in vertical package profile are achieved, at least in part, through the usage of uniquely-formed sidewall conductors, which eliminate or at least reduce the usage of BGAs or similar contact formations to interconnect overlying package layers and the microelectronic devices contained therein. Additionally or alternatively, the package sidewall conductors can be utilized to provide a convenient manner in which microelectronic devices contained within lower package layer(s) can be electrically coupled to a contact formation formed over an upper package layer. The sidewall conductors described herein provide electrically-conductive paths between package layers, and from the package topside to the package bottom, in certain embodiments. Further, the sidewall conductors formed pursuant to the below-described fabrication method are protected from damage during subsequent manufacturing processing and transport.

FIG. 1 is a flowchart of an embodiment of a method 100 for fabricating a number of stacked microelectronic packages each including two or more microelectronic devices electrically coupled to, and possibly interconnected by, a plurality of sidewall conductors formed on the package sidewalls. As shown in FIG. 1 and described in detail below, method 100 is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of stacked microelectronic packages or certain components included within the microelectronic packages are well-known and, in the interests of brevity, will only be mentioned briefly herein or will be omitted entirely without providing the well-known process details. It will be appreciated that method 100 can be utilized to produce various other types of stacked microelectronic packages.

Referring to FIG. 1, method 100 begins with the production of a number of package layers in process 102. The package layers produced during process 102 of method 100 are also commonly referred to as individual "packages"; however, the phrase "package layers" is utilized predominately herein to distinguish between the package layers or packages that are stacked and interconnected to produce the completed stacked microelectronic packages and the completed microelectronic packages themselves. The completed microelectronic packages produced pursuant to the below-described method are also commonly referred to as a Package-on-Package (PoP) devices or System-in-Package (SiP) devices, depending upon the particular manner in which the completed microelectronic packages are implemented. Any method suitable for fabricating a stackable package or package layer having at least one electrically-conductive element exposed through a package sidewall and electrically coupled to microelectronic device contained within the package layer can be carried-out during process 102 of method 100.

Figure 2:
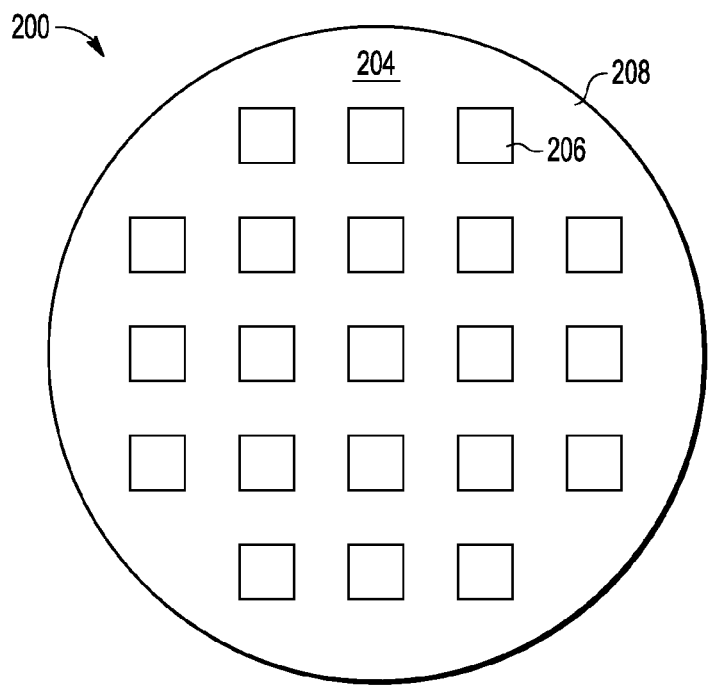
FIG. 2 is a top-down view illustrating a partially-completed microelectronic device panel 200.

FIG. 2 is a top-down view illustrating a partially-completed microelectronic device panel 200, which may be produced utilizing an redistributed chip package (RCP) process performed during process 102 of method 100 (FIG. 1). Device panel 200 includes a panel body 208 in which a plurality of microelectronic devices 206 are embedded. Microelectronic devices 206 may be substantially identical or may instead vary in type, function, size, etc.; e.g., certain ones of devices 206 may be a first type of device (e.g., ASIC die), while others of devices 206 may be a second type of device (e.g., MEMS devices). Devices 206 are exposed through major surface 204 of panel body 208 (referred to herein as "device surface 204"). In the illustrated example, device panel 200 includes twenty one square-shaped devices 206 arranged in a grid pattern or array; however, the number of microelectronic devices, the planform dimensions of the microelectronic devices (e.g., the die shape), and the manner in which the devices are spatially distributed within panel body 208 will vary amongst embodiments. Panel body 208 is typically produced as a relatively thin, disc-shaped body or mass having a generally circular planform geometry; however, panel body 208 can be fabricated to have any desired shape and dimensions. Panel body 208 can have a thickness equivalent to or slightly exceeding the maximum height of microelectronic devices 206 (i.e., the die height when devices 206 are semiconductor die) to minimize the overall vertical profile of the completed stacked microelectronic package.

Microelectronic device panel 200 can be produced in following manner. First, microelectronic devices 206 are positioned in a desired spatial arrangement over the surface of a support substrate or carrier (not shown); e.g., devices 206 may be arranged over the carrier in a grid array of the type shown in FIG. 2. If desired, one or more release layers may also be applied or formed over the carrier's upper surface prior to positioning of microelectronic devices 206. A mold frame, which has a central cavity or opening therethrough, is positioned over the carrier and around the array of microelectronic devices 206. An encapsulant, such as a silica-filled epoxy, is then dispensed into the cavity of the mold frame and flows over microelectronic devices 206. Sufficient volume of the encapsulant is typically dispensed over microelectronic devices 206 to enable the encapsulant to flow over the uppermost or non-contact-bearing surfaces of devices 206. The encapsulant may then be solidified by, for example, an oven cure to yield a solid panel body in which microelectronic devices 206 are embedded. Panel body 208 may be rigid or flexible, depending upon the chosen encapsulant. Panel body 208 is then released from the carrier to reveal the backside of body 208 through which devices 206 are exposed; i.e., device surface 204 in the embodiment shown in FIG. 2. If desired, the front side of panel body 208 may be ground or polished to bring device panel 200 to a desired thickness prior to release of the panel body from the carrier. The foregoing example notwithstanding, panel body 208 can be produced utilizing various other known fabrication techniques including, for example, compression molding and lamination processes.

After encapsulation of microelectronic devices 206 within panel body 208, a plurality of package edge conductors is next fabricated over device surface 204 of microelectronic device panel 200. The term "package edge conductor," as appearing herein, refers to an electrically-conductive element, such as a metal trace, a wire, an interconnect line, a metal-filled trench, a bond pad, or the like, which is electrically coupled to a microelectronic device embedded within a package or package layer and which extends to a sidewall or edge portion of the package to contact a sidewall conductor, such as the sidewall conductors described below in conjunction with FIG. 7. The package edge conductors can assume a wide variety of different forms and, in many embodiments, will consist of or include a number of electrically-conductive lines (e.g., metal traces), vias, metal plugs, and the like, which are formed in a number of dielectric layers (commonly referred to as a "build-up layers," "metal layers," or "redistribution layers" (RDLs)), and which collectively provide an electrically conductive path between an encapsulated microelectronic device and a package sidewall conductor formed on the package sidewall, as described below in conjunction with FIG. 7.

Figure 3:
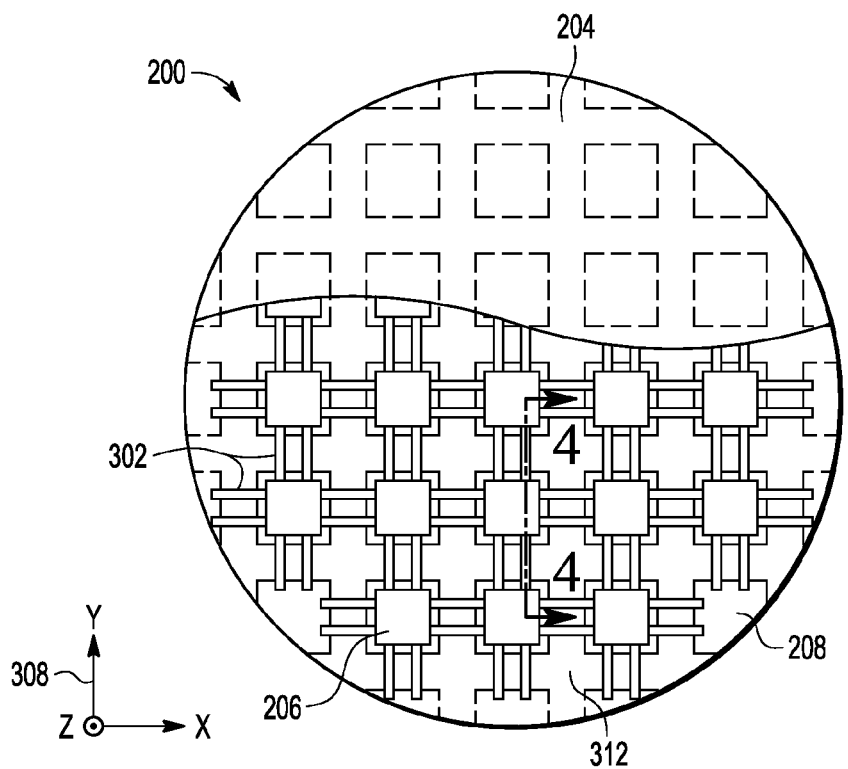
FIG. 3 illustrates an embodiment of a number of package edge conductors that can be formed during production of redistributed chip package (RCP) device panel of FIGS. 1 and 2.
Figure 4:
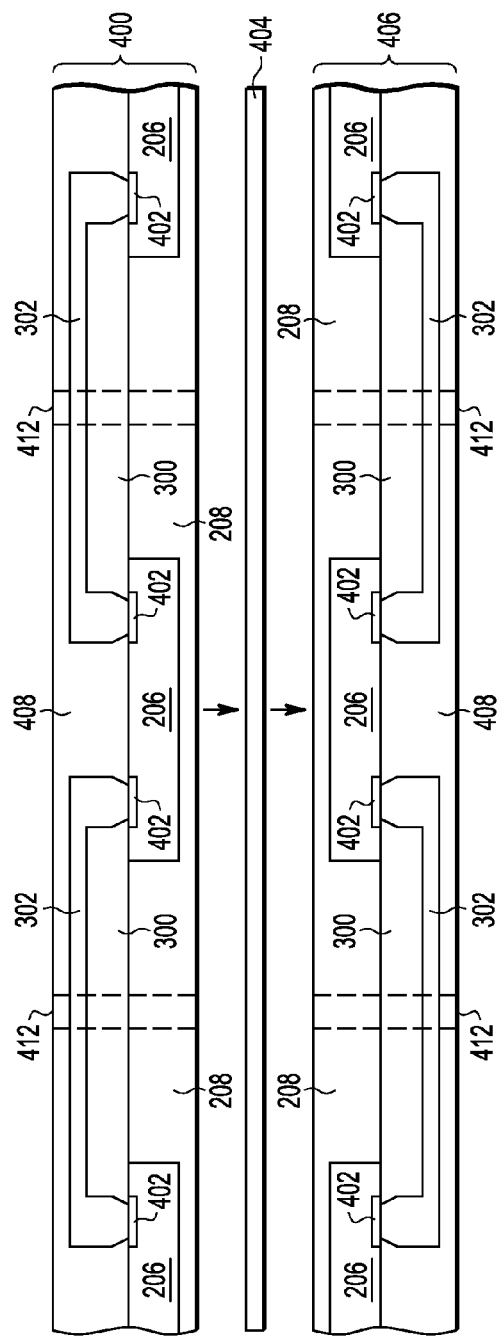
FIG. 4 further illustrates, in greater detail, an exploded cross-sectional view of a portion of the microelectronic package of FIG. 3 as taken in cross-section along line 4-4 identified in FIG. 3 and depicting a manner which a first package layer may be positioned in stacked relationship with a second package layer to produce a partially-completed stacked microelectronic package.

By way of non-limiting example, FIG. 3 illustrates a number of package edge conductors 302 that can be formed over device surface 204 during production of device panel 200. FIG. 4 further illustrates, in greater detail, a portion of microelectronic device panel 200, as taken in cross-section along line 4-4 identified in FIG. 3. In this particular example, package edge conductors 302 assume the form of a number of interconnect lines or metal (e.g., copper) traces and can consequently also be referred to as "traces 302" hereafter. Conductors 302 extend along a plane parallel with device surface 204 or, stated differently, along the x-y plane identified in FIG. 3 by coordinate legend 308. Conductors 302 can be produced using bumping or wafer level packaging fabrication techniques such as sputtering, plating, jetting, or stencil printing (e.g., of an electrically-conductive ink), to list but a few examples. Conductors 302 will typically be formed in one or more layers of dielectric material 300 (shown in FIG. 4 and not shown in FIG. 3 to more clearly illustrate the positioning of microelectronic devices 206 with respect to conductors 302).

As may be appreciated most readily with reference to FIG. 4, package edge conductors 302 are electrically coupled to a number of landing pads or other electrical contact points 402 provided on each microelectronic device 206. Package edge conductors 302 may be electrically connected to contact points 402 by filled vias, plated vias, metal plugs, or the like formed through the dielectric layer or layers underlying package edge conductors 302 utilizing bumping, wafer level packaging, or other known processing techniques. After formation of package edge conductors 302, one or more overlying dielectric, capping, or passivation layers 408 may be formed over package edge conductors 302 utilizing a spin-on coating process, printing, lamination, or another deposition technique.

Package edge conductors 302 extend from their respective microelectronic devices 206 to neighboring dicing streets 412, which surround or border each device 206. Dicing streets 412 represent portions of device panel 200 located between and around devices 206, which lack electrically-active elements and along which the stacked microelectronic packages are divided during singulation. Dicing streets 412 are also commonly referred to as "saw streets"; however, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring package edge conductors 302, which extend along aligning axes 308 (i.e., the x- or y-axis, as identified in FIG. 3), can be formed to connect or meet within dicing streets 412 and thereby form a continuous conductive line extending between neighboring microelectronic devices 206; however, this is by no means necessary as the portions of package edge conductors 302 extending into dicing streets 412 will later be removed during singulation of device panel 200, as described below in conjunction with FIG. 7.

While a single layer or level of package edge conductors or traces 302 are formed over device panel 200 in the example shown in FIGS. 3 and 4, multiple layers or levels of conductors 302 can be formed over microelectronic device panel 200 in other embodiments. Furthermore, in embodiments wherein one or more of the individual package layers 400, 406 include multiple embedded microelectronic devices, conductors may also be formed at this juncture in the fabrication process in conjunction with the formation of package edge conductors 302, to interconnect the multiple devices included within each package layer.

Figure 5:
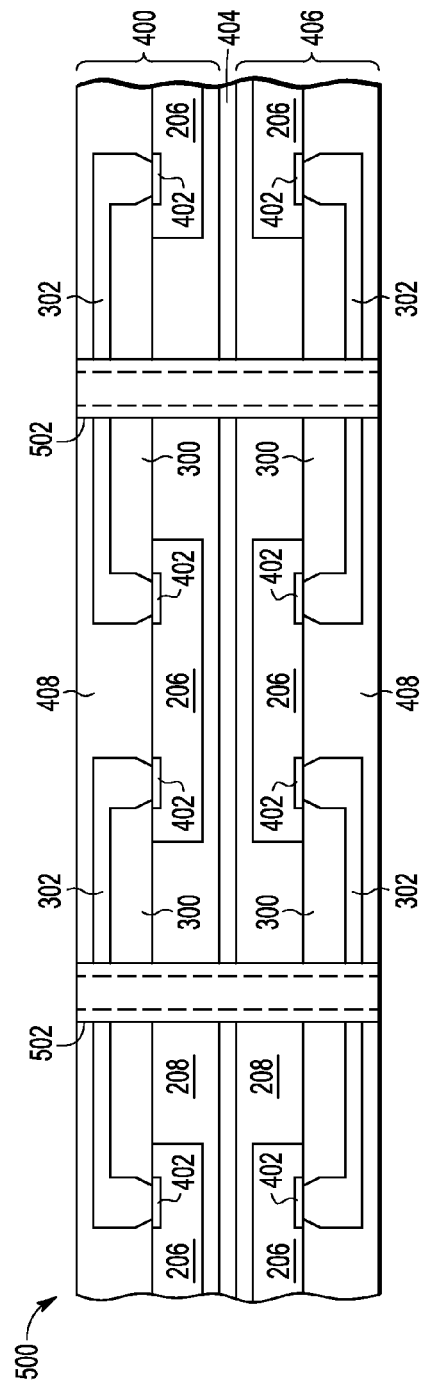
FIG. 5 illustrates, in cross-sectional view, the portion of the microelectronic device panel of FIG. 4 after a subsequent stage of manufacture.

In process 104 of method 100 (FIG. 1), package layers 400 produced during process 102 are now combined with one or more additional package layers 406 to produce partially-completed stacked microelectronic layers 500, as illustrated by a cross-sectional view in FIG. 5. Any suitable number of additional device layers may also be included within the stacked microelectronic package. For convenience of explanation, RCP package layer 406 is illustrated as being substantially identical to package layer 400. For example, as does package layer 400, package layer 406 includes a molded panel body 208, one or more microelectronic devices 206 embedded in panel body 208, and a plurality of package edge conductors 302 (e.g., metal traces). In view of the illustrated orientation of microelectronic layers 500, package layer 400 will be referred to as "upper package layer 400" herein below, while package layer 406 is referred to as "lower package layer 406." It should be understood, however, that this terminology is used for convenience of reference only, that the orientation of the completed stacked microelectronic package is arbitrary, and that the microelectronic package will often be inverted during later processing steps and/or when incorporated into a larger electronic system or device.

Package layers 400 and 406 (and any additional microelectronic device panels included within partially-completed stacked microelectronic layers 500) can be laminated together during process 104 of method 100. As indicated in FIGS. 4 and 5, this may be accomplished by applying or otherwise positioning an intervening bonding layer 404 between microelectronic device package layers 400 and 406 prior to package stacking. Bonding layer 404 can be an epoxy or other adhesive, which may be applied over the upper surface of lower package layer 406 and thermally cured after positioning of upper package layer 400. This example notwithstanding, any suitable bonding material or means can be utilized to bond package layers 400 and 406 together including, for example, double-sided adhesive tape. By laminating microelectronic device package layers 400 and 406 together in this manner, the relative positioning of package layers 400 and 406 and, therefore, the relative positioning of the microelectronic devices 206 embedded within package layers 400 and 406 can be maintained during processing and after singulation into discrete stacked microelectronic layers 500. Package layers 400 and 406, and any other package layers to be included within the stacked microelectronic layers 500, can be tested prior to stacking to ensure that only known-good package layers are consolidated during process 104 of method 100 (FIG. 1).

Process 106 includes forming through package vias (TPVs) 502 in stacked microelectronic layers 500. Vias 502 are formed from the top surface of package layer 400 through the bottom surface of package layer 406 creating one or more openings 502 completely through stacked microelectronic layers 500. The opening formed by vias 502 can be wider than saw street 412. Alternatively, the opening formed by vias 502 can be more narrow than the width of saw street 412 but wider than the path formed by the tool used to cut through saw street 412. As a further alternative, two adjacent or side-by-side vias 502 can be formed within saw street 412 or partially within and partially outside saw street 412.

Vias 502 can be formed at various locations in stacked microelectronic layers 500 including through package edge conductors 302 to electrically connect various components in package layers 400, 406 with one another. Any suitable technique for creating vias 502 can be used including mechanical drilling, laser drilling, or other suitable method. The exposed surfaces of vias 502 can then be cleaned to remove residue created when vias 502 are formed. Cleaning techniques can include using plasma, vacuum cavitational streaming, atmospheric immersion, spray cleaning, acoustic energy, or other suitable technique.

Figure 6:
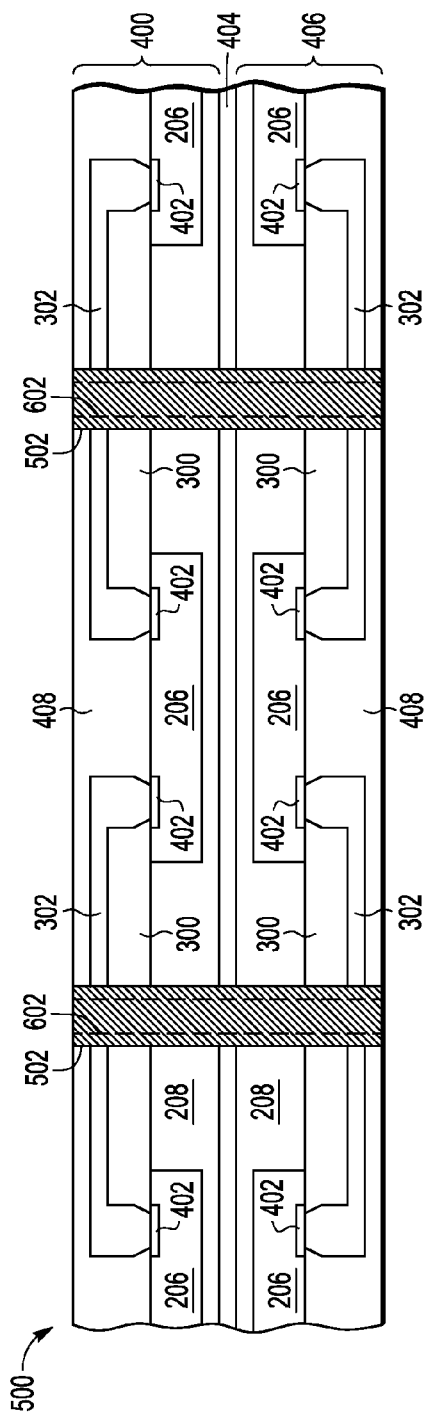
FIG. 6 illustrates, in cross-sectional view, the portion of the microelectronic device panel of FIG. 5 after a subsequent stage of manufacture.

Referring to FIGS. 1 and 6, process 108 includes filling vias 502 with conductive material 602 such as conductive polymer and polymers filled with conductive particles such as metals, alloys of metals, metal coated organics particles, metal coated ceramic particles, solder pastes, solder-filled adhesives, nanoparticle-filled inks, and metal-containing adhesives or epoxies, such as silver-, nickel-, and copper-filled epoxies (collectively referred to herein as "electrically-conductive pastes"). Suitable conductive materials 602 also include low melt point metals and alloys lacking resins or fluxes and having melting points below 300° C. including, but not limited to, indium and bismuth.

Stacked microelectronic layers 500 are singulated to complete production of the package layers during process 110 of method 100 (FIG. 1). As previously indicated, panel singulation can be carried-out by mechanical sawing; however, any suitable separation process can be utilized including laser cutting and scribing with punching. In one embodiment, singulation is performed utilizing a conventional dicing saw, such as a water-cooled diamond saw.

Figure 7:
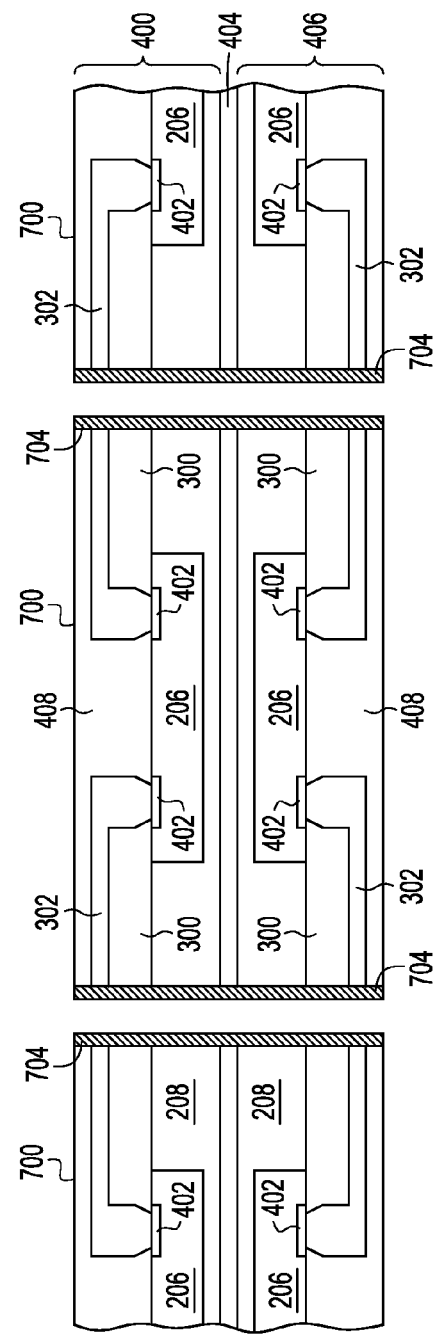
FIG. 7 illustrates, in cross-sectional view, a portion of the microelectronic device panel of FIG. 2 after singulation to yield a plurality of stacked microelectronic package layers.

FIG. 7 illustrates, in cross-sectional view, a portion of stacked microelectronic layers 500 after singulation to yield a plurality of stacked microelectronic devices 700. Each stacked device 700 will typically be cut to have a rectangular shape and, therefore, four vertical package edges or sidewalls. After singulation, a portion of conductive material 602 (FIG. 6) remains along portions of the sidewalls thereby forming sidewall conductors 704. As package edge conductors 302 were previously formed to extend to dicing streets 412 ((FIG. 4, 5, now removed), package edge conductors 302 extend to and are connected to sidewall conductors 704. Package edge conductors 302 can be produced to extend to each of the four vertical package sidewalls in the below-described manner to maximize layer-to-layer connectivity of the finished packaged device; however, this is by no means necessary, and package edge conductors 302 may be fabricated to extend to any other number of package sidewalls in further embodiments.

Figure 10:
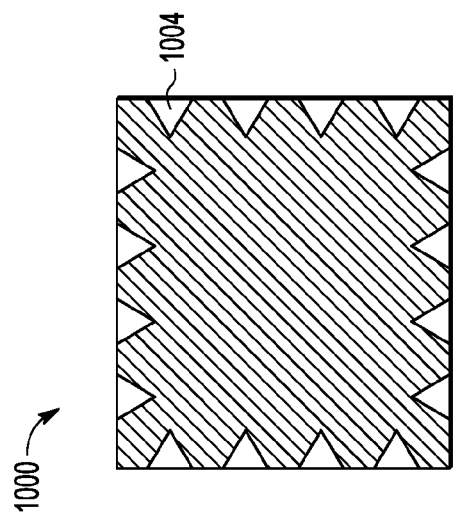
FIGS. 8-10 illustrate top-down views of various embodiments of packaged devices in accordance with the invention.
Figure 9:
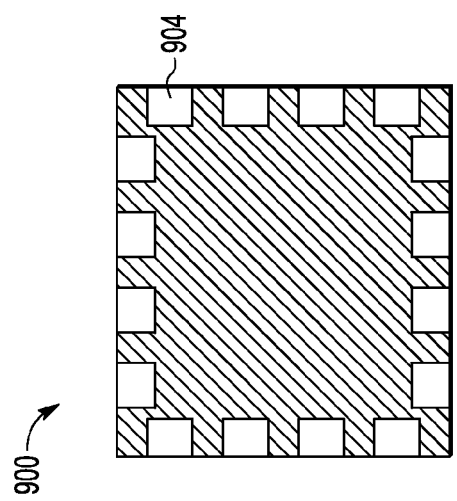
Figure 8:
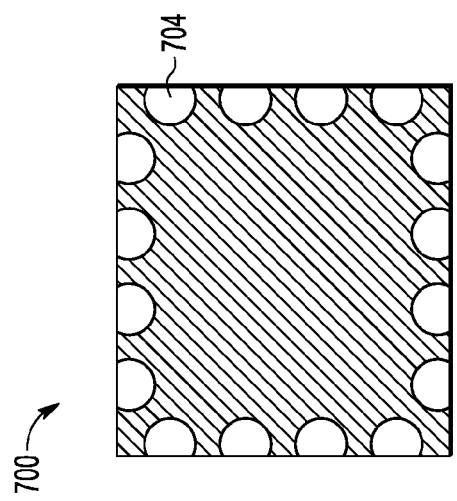

FIG. 8 illustrates a top-down view of stacked device 700 showing semicircular sidewall conductors 704 that are created when vias 502 (FIG. 5) have a circular cross-section. Vias 502 can have other suitable cross-sectional shapes, however, such as shown in FIG. 9 with one or two rectangular vias to form rectangular sidewall conductors 904 and in FIG. 10 with one or two diamond-shaped vias (or two triangular vias) to form triangular sidewall conductors 1004. Other suitable cross-sectional shapes for vias 502 can be used. Additionally, some vias 502 can have a different shape than other vias 502. If two adjacent or side-by-side vias 502 are formed, the tool used to singulate stacked microelectronic layers 500 removes an inner portion of the vias 502 while a portion of vias 502 remain on the sidewall(s) of stacked device 700, 900, 1000 after singulation.

Sidewall conductors 704, 904, 1004 electrically couple different ones (typically pairs) of package edge conductors 302 and thereby interconnect the package layers 400, 406 and, specifically, the microelectronic devices 206 contained therein. Additionally or alternatively, the sidewall conductors 704, 904, 1004 may electrically couple the microelectronic device or devices 206 located in lower package levels or layers to a contact formation formed over the uppermost package level or layer.

Notably, sidewall conductors 704, 904, 1004 do not extend past the sidewalls of stacked devices 700, 900, 1000 and thus remain within the overall dimensions of stacked devices 700, 900, 1000. Since sidewall conductors 704, 904, 1004 do not extend past the sidewalls of stacked devices 700, 900, 1000, there is less chance that sidewall conductors 704, 904, 1004 will be damaged from external bumps with other components during subsequent manufacturing processes or while in transit.

By now it should be appreciated that in some embodiments, a method for fabricating a stacked microelectronic device can comprise attaching a first package layer to a second package layer to form stacked microelectronic layers. Saw streets of the first package layer overlie and are aligned with saw streets of the second package layer, the first and second package layers include respective edge connectors formed between the saw streets and electronic components in the first and second package layers. A through package via is formed in one of the saw streets of the first and second package layers. The via is filled with conductive material. The stacked package layers are singulated along the saw streets in a manner that retains a portion of the conductive material to form a sidewall connector between at least two of the edge connectors.

In another aspect, the plurality of sidewall conductors are formed to electrically couple the electronic devices.

In another aspect, the method can further comprise fabricating the first and second package layers including a first electronic component located in the first package layer and a second electronic component located in the second package layer. The sidewall conductor electrically couples the first microelectronic device to the second microelectronic device.

In another aspect, the via can be wider than the saw street.

In another aspect, the method can further comprise cleaning the via before filling the via with the conductive material.

In other aspects, the via can have a circular, rectangular, diamond, or other suitable cross-sectional shape.

In another aspect, the conductive material does not extend beyond any of the sidewalls of the stacked microelectronic device.

In another aspect, the conductive material can comprise one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxy, electrically-conductive pastes, indium, and bismuth.

In another embodiment, a method of fabricating stacked microelectronic devices can comprise stacking and bonding a plurality of package layers to one another so that scribe streets of the package layers overlie scribe streets of the other package layers. Each layer can include two or more integrated circuits separated by the scribe streets and a plurality of edge conductors having a first end coupled to a respective one of the integrated circuits and a second end extending to a respective one of the scribe streets. A plurality of openings are formed in the scribe streets so that each of the openings intersect at least one of the edge conductors. The openings are filled with conductive material. The conductive material is in contact with at least one of the edge conductors. The stacked package layers are cut along the scribe streets to form the stacked microelectronic devices with at least some of the conductive material remaining and being exposed on sidewalls of the stacked microelectronic devices.

In another aspect, the remaining conductive material forms a plurality of sidewall conductors.

In another aspect, the method can further comprise fabricating the first and second package layers including a first integrated circuit located in a first one of the package layers and a second integrated circuit located in one of the second package layers. The sidewall conductor electrically couples the first integrated circuit to the second integrated circuit.

In another aspect, the via can be wider than the saw street.

In another aspect, the method can further comprise cleaning the via before filling the via with the conductive material.

In another aspect, the sidewall conductor can have a semicircular, rectangular, or triangular cross-section.

In another aspect, the conductive material does not extend beyond any of the sidewalls of the stacked microelectronic devices.

In another aspect, the conductive material can comprise one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxy, electrically-conductive pastes, indium, and bismuth.

In further embodiments, a stacked microelectronic device can comprise a plurality of stacked package layers bonded to one another. Each layer includes an integrated circuit, and a plurality of edge conductors having a first end coupled to the integrated circuit and a second end extending to a sidewall conductor. The sidewall conductor includes conductive material filling an opening in a sidewall of the stacked package layers, the opening extends from a top surface of a top package layer of the plurality of layers to a bottom surface of a bottom package layer of the plurality of layers and the conductive material is flush with the sidewall.

In another aspect, the opening can be formed from a through package via.

Embodiments of the above-described fabrication methods can also be described as providing electrically conductive circuit lines (referred to above as "sidewall conductors" or "sidewall interconnects") at the edge of stacked microelectronic packages.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, ICs formed on semiconductor die, MEMS, passive electronic components, optical devices, and other small scale electronic devices capable of providing processing, memory, sensing, radiofrequency, optical, and actuator functionalities, to list but a few examples. The term "microelectronic package" denotes a structure or assembly containing at least one and typically two or more microelectronic devices, which may or may not be interconnected. The term "stacked microelectronic package" refers to a microelectronic package containing at least two microelectronic devices located within different levels or overlying layers of the microelectronic package. Finally, the term "stacked microelectronic devices" is utilized to collectively refer to two or more microelectronic devices, which are located on different levels of a stacked microelectronic package, as defined above. The term "stacked microelectronic devices" thus does not require that one microelectronic device is necessarily positioned directly above or beneath another.

While at least one embodiment has been presented in the foregoing Detailed Description, it should be appreciated that a vast number of variations exist. It should also be appreciated that the embodiment or embodiments are only examples, and are not intended to limit the scope, applicability, or configuration of the disclosure in any way. Rather, the foregoing Detailed Description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A method for fabricating a stacked microelectronic device, comprising:
    attaching a first package layer to a second package layer to form stacked microelectronic layers, wherein saw streets of the first package layer overlie and are aligned with saw streets of the second package layer, the first and second package layers include respective edge connectors formed between the saw streets and electronic components in the first and second package layers;
    forming a through package via in one of the saw streets of the stacked microelectronic layers;
    filling the via with conductive material;
    singulating the stacked microelectronic layers along the saw streets in a manner that retains a portion of the conductive material to form a sidewall connector between at least two of the edge connectors.

2. A method according to claim 1 wherein the plurality of sidewall conductors are formed to electrically couple the electronic devices.

3. A method according to claim 1 further comprising:
    fabricating the first and second package layers including a first electronic component located in the first package layer and a second electronic component located in the second package layer, wherein the sidewall conductor electrically couples the first electric component to the second electronic component.

4. A method according to claim 1 wherein the via is wider than the saw street.

5. A method according to claim 1 further comprising cleaning the via before filling the via with the conductive material.

6. A method according to claim 1 wherein the via is circular.

7. A method according to claim 1 wherein the conductive material does not extend beyond any of the sidewalls of the stacked microelectronic device.

8. A method according to claim 1 wherein the conductive material comprises one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxy, electrically-conductive pastes, indium, and bismuth.

9. A method according to claim 1 wherein the via is rectangular.

10. A method according to claim 1 wherein the via is diamond shaped.

11. A method of fabricating stacked microelectronic devices, comprising:
    stacking and bonding a plurality of package layers to one another, wherein scribe streets of the package layers overlie scribe streets of the other package layers, wherein each layer includes two or more integrated circuits separated by the scribe streets and a plurality of edge conductors having a first end coupled to a respective one of the integrated circuits and a second end extending to a respective one of the scribe streets;
    forming a plurality of openings in the scribe streets after the stacking and bonding the plurality of package layers to one another, wherein each of the openings intersect at least one of the edge conductors;

filling the openings with conductive material, wherein the conductive material is in contact with at least one of the edge conductors;

cutting the stacked package layers along the scribe streets to form the stacked microelectronic devices with at least some of the conductive material remaining and being exposed on sidewalls of the stacked microelectronic devices.

12. A method according to claim 11 wherein the remaining conductive material forms a plurality of sidewall conductors.

13. A method according to claim 11 further comprising:
fabricating the package layers including mounting a first integrated circuit on a first one of the package layers and mounting a second integrated circuit on one of the second package layers, wherein the sidewall conductor electrically couples the first integrated circuit to the second integrated circuit.

14. A method according to claim 11 wherein the via is wider than the saw street.

15. A method according to claim 11 further comprising cleaning the via before filling the via with the conductive material.

16. A method according to claim 11 wherein the conductive material does not extend beyond any of the sidewalls of the stacked microelectronic devices.

17. A method according to claim 11 wherein the conductive material comprises one of a group consisting of: an electrically conductive adhesive, conductive polymer, a polymer filled with conductive particles, a metal alloy, metal coated organic particles, metal coated ceramic particles, solder paste, solder-filled adhesive, nanoparticle-filled ink, a metal-containing adhesive, a metal-containing epoxy, electrically-conductive pastes, indium, and bismuth.

18. A method according to claim 11 wherein the sidewall conductor has one of a group consisting of a semicircular cross-section, a rectangular cross-section, and a triangular cross-section.

* * * * *